(12) United States Patent
Tsukamoto

(10) Patent No.: US 7,585,694 B2
(45) Date of Patent: Sep. 8, 2009

(54) MANUFACTURING METHOD OF SOLID-STATE IMAGING DEVICE

(75) Inventor: Akira Tsukamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 249 days.

(21) Appl. No.: 11/884,017

(22) PCT Filed: Mar. 22, 2006

(86) PCT No.: PCT/JP2006/306371

§ 371 (c)(1), (2), (4) Date: Aug. 9, 2007

(87) PCT Pub. No.: WO2006/106699

PCT Pub. Date: Oct. 12, 2006

(65) Prior Publication Data

US 2008/0213935 A1 Sep. 4, 2008

(30) Foreign Application Priority Data

Mar. 31, 2005 (JP) .............................. 2005-102203

(51) Int. Cl.
H01L 21/00 (2006.01)

(52) U.S. Cl. ........................... 438/60; 438/75; 438/144; 257/E31.075; 257/E31.078; 257/E31.081; 257/E31.084; 257/E21.617

(58) Field of Classification Search .......... 257/E21.617, 257/E31.075, E31.078, E31.081, E31.084; 438/60, 75, 144

See application file for complete search history.

(56) References Cited

U.S. PATENT DOCUMENTS

| | | | |
|---|---|---|---|
| 4,901,129 A | 2/1990 | Hynecek | |
| 5,210,433 A | 5/1993 | Ohsawa et al. | |
| 5,241,198 A | 8/1993 | Okada et al. | |
| 5,302,545 A | 4/1994 | Okada et al. | |
| 6,472,255 B1 | 10/2002 | Hatano et al. | |
| 2004/0217390 A1 * | 11/2004 | Inagaki | 257/225 |

FOREIGN PATENT DOCUMENTS

JP 1-138750 5/1989

(Continued)

OTHER PUBLICATIONS

JP 08-153870 A, Jun. 1996, Japan, Toyama, Shigeru, H01L 29/762 (English Machine Translation).*

Primary Examiner—N Drew Richards
Assistant Examiner—Yu-Hsi Sun
(74) Attorney, Agent, or Firm—McDermott Will & Emery LLP

(57) ABSTRACT

Provided is a manufacturing method of a CCD solid-state imaging device having such an impurity concentration distribution with which shading is reduced and formation of a buried channel endowed with a large saturation signal charge amount is made possible. The manufacturing method includes: an oxide layer forming step of forming an oxide layer (12) on a semiconductor substrate (11); an ion implantation step of performing ion implantation through the oxide layer (12) to the semiconductor substrate (11) thereby forming a well in a position corresponding to a charge transfer portion; and an insulation layer forming step of performing insulation layer forming processing to the oxide layer (12) having undergone the ion implantation step, at least in a position corresponding to the well.

23 Claims, 14 Drawing Sheets

FOREIGN PATENT DOCUMENTS

| | | |
|---|---|---|
| JP | 1-185970 | 7/1989 |
| JP | 7-22610 | 1/1995 |
| JP | 08-153870 A * | 6/1996 |
| JP | 8-288492 | 11/1996 |
| JP | 2618939 | 3/1997 |
| JP | 3162440 | 2/2001 |

* cited by examiner

CONVENTIONAL TECHNOLOGY

PRESENT INVENTION

MANUFACTURING METHOD OF SOLID-STATE IMAGING DEVICE

RELATED APPLICATIONS

This application is the U.S. National Phase under 35 U.S.C. § 371 of International Application No. PCT/JP2006/306371, filed on Mar. 22, 2006, which in turn claims the benefit of Japanese Application No. 2005-102203, filed on Mar. 31, 2005, the disclosures of which Applications are incorporated by reference herein.

TECHNICAL FIELD

The present invention relates to a manufacturing method of a solid-state imaging device, and particularly relates to a solid-state imaging device with an improved charge transfer portion for transferring signal charge.

BACKGROUND ART

Conventionally, solid-state imaging devices used in video cameras, digital still cameras, and the like adopt a CCD solid-state imaging device (CCD indicates "charge coupled device"). Such a CCD solid-state imaging device includes a photodiode, a vertical charge transfer portion (vertical CCD), a horizontal charge transfer portion (horizontal CCD), a charge detection portion (FD portion), and an output amplifier. The photodiode generates signal charge by means of photoelectric conversion, and the vertical CCD and the horizontal CCD transfer the signal charge to the FD portion, and the FD portion detects the signal charge.

In recent years, CCD solid-state imaging devices of the above-stated structure are required to realize high pixel densities for higher resolution as well as size reduction of the apparatuses themselves. There have already been attempts for improving charge transfer portions so as to restrain deterioration in signal charge caused by untransferred charge and the like as well as to satisfy the mentioned requests (e.g. Patent reference 1).

As shown in the schematic cross sections of FIG. 17, a charge transfer portion is formed after undergoing: an oxide layer forming step of forming an oxide layer 92 on a semiconductor substrate 91; an ion implantation step of ion-implanting p-type impurity such as boron (B) through the oxide layer 92 to form a p-well and then ion-implanting n-type impurity such as arsenic (As) and phosphorus (P) through the oxide layer 92 thereby forming an n-well of the charge transfer portion; an insulation-layer forming step of removing the oxide layer 92 and then performing thermal oxidation to form a gate insulation layer 93; and a gate-electrode forming step of forming a gate electrode 94 on the gate insulation layer 93.

When a charge transfer portion is formed using the above-stated method, the resulting insulation layer 93 will have a uniform layer thickness for each of the vertical CCD, the horizontal CCD, and the output amplifier. However, since the ideal layer thickness is different among the vertical CCD, the horizontal CCD, and the output amplifier, several methods of forming a gate insulation layer having an ideal layer thickness have been already disclosed. For example, Patent reference 2 realizes the ideal layer thickness by utilizing characteristics of a so-called ONO insulation layer.

Patent reference 1:
   Japanese Laid-open Patent Application No. H08-288492

Patent reference 2:
   Japanese Patent No. 3162440

The charge transfer portion includes a high potential area for accumulating signal charge, and so is provided with a so-called buried channel that functions to prevent signal charge from accumulating at the substrate's surface. In the ion implantation step, the peak concentration of the impurity concentration distribution of the implanted ion (i.e. impurity) is set to be positioned within the silicon substrate, for the purpose of successful provision of the stated high potential area within the silicon substrate.

Immediately after the ion implantation, the above-stated setting is effective at providing the substrate with an impurity concentration distribution favorable enough to form a predetermined charge accumulation area. After the insulation layer forming step, however, the favorable impurity concentration distribution cannot be maintained, incurring reduction in saturated signal amount that can be accumulated within the substrate, or occurrence of shading due to loss in transfer charge amount. In particular, if each one of pixels is subjected to the mentioned problems as the pixel densities become higher, it will lead to noticeable deterioration in the display function.

The present invention has been conceived in view of the stated problems, and has an object of providing a manufacturing method of a CCD solid-state imaging device having such an impurity concentration distribution with which shading is reduced and formation of a buried channel endowed with a large saturated signal charge amount is made possible.

DISCLOSURE OF THE INVENTION

So as to solve the stated problems, the present invention adopts a manufacturing method of a solid-state imaging device, the manufacturing method having: an oxide layer forming step of forming an oxide layer on a semiconductor substrate; an ion implantation step of performing ion implantation through the oxide layer to the semiconductor substrate thereby forming a well in a position corresponding to a charge transfer portion; and an insulation layer forming step of performing insulation layer forming processing to the oxide layer having undergone the ion implantation step, at least in a position corresponding to the well.

In the above structure, it is desirable that the insulation layer forming processing is oxidation that is performed to at least one of the oxide layer and a surface of the semiconductor substrate.

The above manufacturing method may preferably have at least one layer-thickness adjustment step of, before the insulation layer forming step, performing etching to at least part of the oxide layer formed in the oxide layer forming step. In addition, the manufacturing method may further preferably have: an amplifier forming step of forming an output amplifier to the semiconductor substrate, the output amplifier being operable to convert to a signal voltage a signal charge outputted from the charge transfer portion and to output the signal voltage to outside, where in the layer-thickness adjustment step, a part of the oxide layer corresponding to the output amplifier is removed by means of the etching. Here, such a structure is further preferable in which the layer-thickness adjustment step includes: a first substep of performing etching, to adjust a layer thickness, at least to a part of the oxide layer corresponding to the charge transfer portion; and a second substep of performing etching to the part of the oxide layer corresponding to the output amplifier for the purpose of the removal.

In addition, the manufacturing method may preferably further have, before the oxide layer forming step: a preliminary oxide layer forming step of forming a preliminary oxide layer on the semiconductor substrate; and a removal step of removing at least part of the formed preliminary oxide layer. In addition, the manufacturing method may preferably still further have an amplifier forming step of forming an output amplifier to the semiconductor substrate, the output amplifier being operable to convert to a signal voltage a signal charge outputted from the charge transfer portion and to output the signal voltage to outside, where the charge transfer portion includes a vertical charge transfer sub-portion and a horizontal charge transfer sub-portion, and the part of the preliminary oxide layer removed in the removal step corresponds, in position, to the vertical charge transfer sub-portion and the output amplifier.

Here, it is preferable that in the ion implantation step, annealing under temperature of 950° C. or above is performed after performing the ion implantation, and oxidation performed after the ion implantation step is performed under temperature of 950° C. or below.

Adoption of such a structure is also possible that as a result of the insulation layer forming step, a silicon nitride layer is formed on the oxide layer having undergone the ion implantation step.

In the above structure too, the manufacturing method may preferably have at least one layer-thickness adjustment step of performing etching to at least part of the oxide layer. In addition, the manufacturing method may preferably further have an amplifier forming step of forming an output amplifier to the semiconductor substrate, the output amplifier being operable to convert to a signal voltage a signal charge outputted from the charge transfer portion and to output the signal voltage to outside, where in the layer-thickness adjustment step, at least a part of the oxide layer corresponding to the output amplifier is removed by means of the etching. Here, such a structure is further preferable in which the layer-thickness adjustment step includes: a first substep of performing etching, to adjust a layer thickness, to at least a part of the oxide layer corresponding to the charge transfer portion; and a second substep of performing etching to at least the part of the oxide layer corresponding to the output amplifier for the purpose of the removal.

Here, the manufacturing method may preferably further have an amplifier forming step of forming an output amplifier to the semiconductor substrate, the output amplifier being operable to convert to a signal voltage a signal charge outputted from the charge transfer portion and to output the signal voltage to outside; and a removal step of removing a part of the silicon nitride layer that corresponds to the output amplifier.

In addition, the manufacturing method may preferably further have, before the oxide layer forming step: a preliminary oxide layer forming step of forming a preliminary oxide layer on the semiconductor substrate; and a removal step of removing at least part of the formed preliminary oxide layer. The manufacturing method may preferably still further have: an amplifier forming step of forming an output amplifier to the semiconductor substrate, the output amplifier being operable to convert to a signal voltage a signal charge outputted from the charge transfer portion and to output the signal voltage to outside, where the charge transfer portion includes a vertical charge transfer sub-portion and a horizontal charge transfer sub-portion, and the part of the preliminary oxide layer removed in the removal step corresponds, in position, to the vertical charge transfer sub-portion and the output amplifier.

The charge transfer portion includes a vertical charge transfer sub-portion and a horizontal charge transfer sub-portion, and in the ion implantation step, an accelerating energy of the ion implantation is set so that an implantation range of the ion implantation in the semiconductor substrate is in a range of 1 to 2 times a layer thickness of part of an insulation layer that results from the insulation layer forming step, the part of the insulation layer corresponding to the vertical charge transfer sub-portion.

In addition, the manufacturing method further has: a conductive-layer forming step of forming a conductive layer on an insulation layer that results from the insulation layer forming step; and a gate-electrode forming step of forming a transfer electrode by patterning the conductive layer.

In the above description, the expression "performing insulation layer forming processing to the oxide layer having undergone the ion implantation step" specifically means to perform the insulation layer forming step while maintaining the already-formed oxide layer in the state after undergoing the ion implantation step. The expression also includes a case of performing the insulation layer forming step with the oxide layer only partially removed without completely removing the oxide layer (i.e. with at least part of the substrate's surface covered with the oxide layer).

(Effect of the Present Invention)

The inventors of the present invention consider the main cause of the impurity concentration distribution fluctuation is that the conventional technology, in the insulation layer forming step, removes the oxide layer formed for the purpose of the ion implantation step. More detail for the considered cause is given below. First, with the conventional technique, the oxide layer is removed to expose the substrate's surface, and then a new thermal oxide layer is formed to the exposed surface, and so the impurity within the substrate moves out to the thermal oxide layer by the heat balance as if the thermal oxide layer is absorbing the impurity. Second, the impurity implanted into the substrate disperses from the substrate's surface to outside because of the exposure of the substrate's surface.

In view of this, contrary to the conventional technique, the manufacturing method of a CCD solid-state imaging device of the present invention forms an insulation layer onto an already formed oxide layer in a position corresponding to a charge transfer portion without removing the oxide layer before formation of the insulation layer. Accordingly, the position of the substrate's surface that corresponds to the charge transfer portion and in which impurity has been implanted will not be exposed during the manufacturing processes. As a result, it becomes possible to restrain fluctuation of the impurity concentration distribution and to maintain the impurity concentration distribution set in the ion implantation step, without experiencing the problem caused with the conventional technique. This is advantageous because it becomes possible to restrain reduction in saturated signal amount or loss of charge transfer amount. In this way, the manufacturing method of the present invention is advantageous, and its effect will be more appreciated as the pixel densities become higher.

If further oxidation is performed in the insulation layer forming step to the remaining oxide layer as it is, the present invention also produces an effect of recovering the remaining oxide layer whose crystalline structure has been damaged by the ion implantation.

Moreover, by adopting a structure of stacking a silicon nitride layer on the remaining oxide layer, the present invention is able to assuredly prevent the impurity included in the substrate from dispersing to outside.

In addition, the present invention may include a step of maintaining, for a position corresponding to the charge transfer portion, the oxide layer having used in the ion implantation step as it is, while removing part of the oxide layer corresponding in position to the output amplifier. With the stated step, the present invention has another advantage of optimizing the gate insulation layer corresponding to the output amplifier, and of improving the quality of the output amplifier.

Furthermore, the present invention may include a step of forming a preliminary oxide layer and having the preliminary oxide layer remain only in position corresponding to the horizontal CCD. With the stated step, the present invention is able to optimize a gate insulation layer corresponding to other positions than a position corresponding to the vertical CCD, and to improve the quality of the output amplifier.

By adopting the stated manufacturing method, the present invention is able to structure a vertical CCD, a horizontal CCD, and an output amplifier, which are respectively excellent in charge transfer efficiency.

BEST MODE FOR CARRYING OUT THE INVENTION

As follows, a manufacturing method of a CCD solid-state imaging device according to the present embodiment is described with reference to the related drawings. Note that the following description relates to a CCD solid-state imaging device of a so-called interline transfer system, but the present invention may be applied to a CCD solid-state imaging device adopting a different system.

Figure 1:
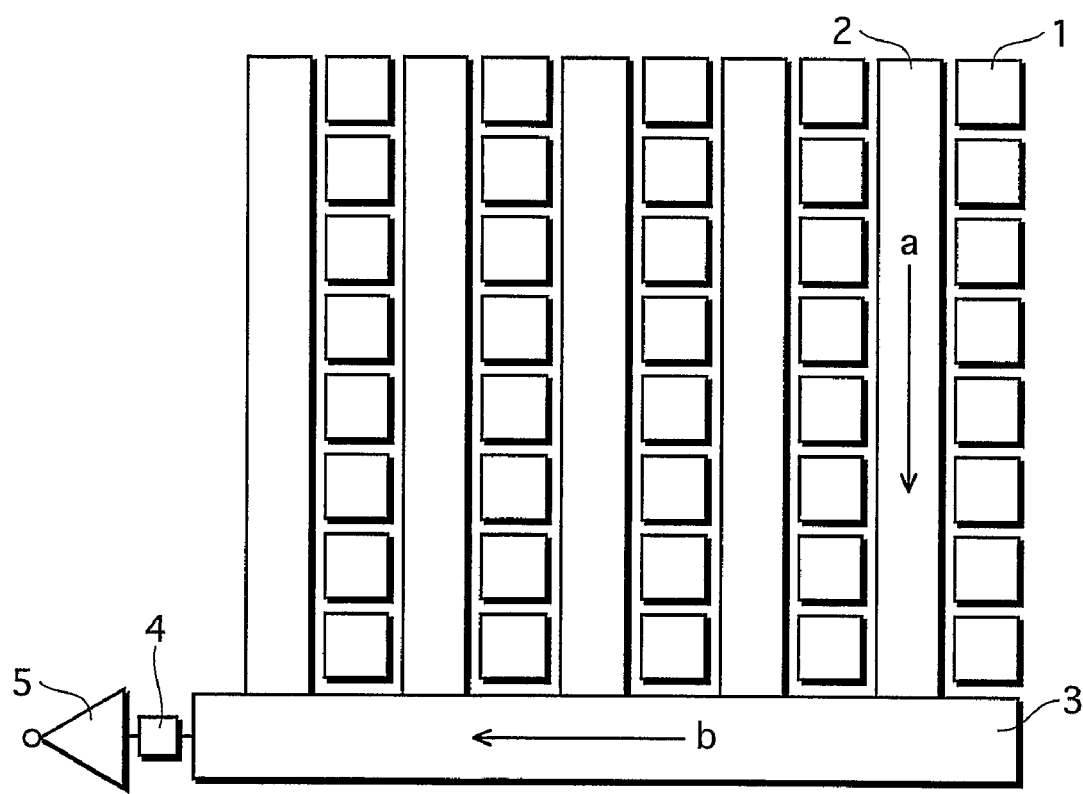
FIG. 1 is a schematic plan view of the structure of a CCD solid-state imaging device of the present invention.

FIRST EMBODIMENT 1-1. Manufacturing Method of a CCD Solid-state imaging device According to the First Embodiment As shown in a FIG. 1, a CCD solid-state imaging device includes a photodiode 1, a vertical CCD 2, a horizontal CCD 3, an FD portion 4, and an output amplifier 5. The stated components are formed in respective areas of a silicon substrate by performing necessary steps of forming a gate insulation layer, a gate electrode, and the like. In addition, p-type impurity and n-type impurity are implanted into respective areas corresponding to the vertical CCD2 and the horizontal CCD 3 that have to be endowed with a charge transfer function.

Figure 2:
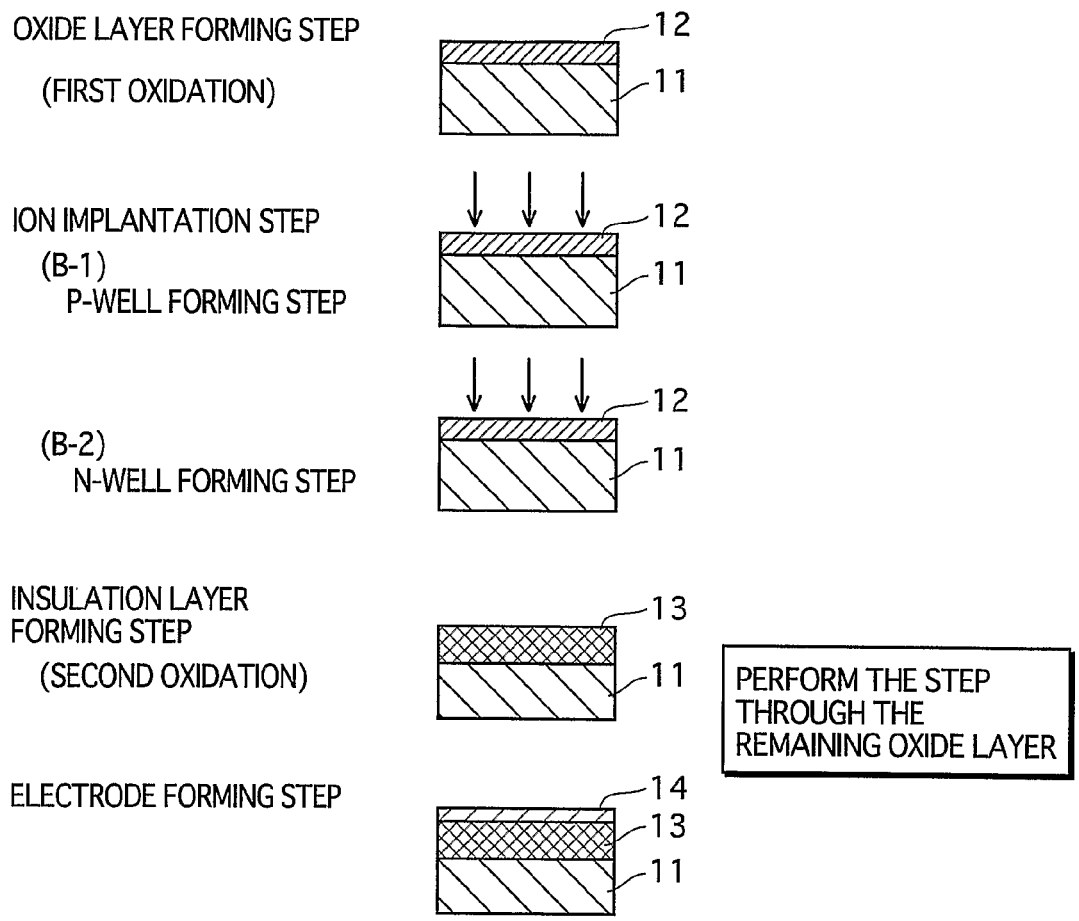
FIG. 2 is a schematic sectional view for showing a manufacturing method of a vertical CCD according to the first embodiment.

A manufacturing method of the above-stated CCD solid-state imaging device is described with reference to FIG. 2. Note that FIG. 2 shows a schematic cross section of the vertical CCD 2. The manufacturing method of the CCD solid-state imaging device according to the present embodiment includes an oxide layer forming step, an ion implantation step, an insulation layer forming step, and an electrode forming step.

In the oxide layer forming step, a silicon substrate 11 (hereinafter simply "substrate 11") is heated to be oxidized, thereby forming an oxide layer 12. The layer thickness of the oxide layer 12 is 5 nm-50 nm.

The ion implantation step is performed after the oxide layer forming step. The ion implantation step starts by ion-implanting p-type impurity such as boron (accepter ion) through the oxide layer 12 ("p-well forming step" in the drawing). Then n-type impurity such as arsenic and phosphorus (donor ion) is ion-implanted through the oxide layer 12 thereby forming a buried channel ("n-well forming step" in the drawing). During the ion implantation step, a portion corresponding to the output amplifier is masked by means of photoresist, and the like. By performing ion implantation through the oxide layer 12, it becomes possible to scatter the implanted ion in the oxide layer 12 so as to prevent the channeling attributable to the crystallization of the substrate 11, and further to protect the substrate 11 from metal contamination or from alkali metal. During the ion implantation, the range (Rp) of n-type impurity is set larger than the layer thickness of the oxide layer 12 and that the peak of the concentration distribution of the n-type impurity falls within the substrate 11.

Next, the insulation layer forming step is performed without removing the oxide layer 12 after the n-type impurity has been implanted in the ion implantation step. Specifically in the insulation layer forming step, heat oxidation is performed again by subjecting the substrate to a certain oxygen atmosphere. By this operation, an oxide layer 13 having a desired layer thickness is formed in combination with the oxide layer 12. Note that for convenience of the following explanation, the oxide layer 12 formed as a result of the oxide layer forming step is referred to as a first oxide layer 12, and the oxide layer 13 formed after going through the insulation layer forming step is referred to as a second oxide layer 13.

For example, a second oxide layer 13 (layer thickness of 30 nm) is formed with respect to the substrate 11, on a surface of which the first oxide layer 12 (layer thickness of 20 nm) has already been formed. The forming condition for the second oxide layer 13 is such that an oxide layer having a layer thickness of 20 nm results if on an exposed surface of the substrate 11. Here, the layer thickness of 30 nm is a thickness from the surface of the substrate 11 up to the surface of the second oxide layer 13. However, the relation between the layer thicknesses of the first oxide layer 12 and of the second oxide layer 13 changes according to the oxidation temperature, the oxidation atmosphere, and the pressure, and so it is necessary to confirm the relation by experiments in advance.

In the subsequent electrode forming step, a conductive layer made of polysilicon and the like is stacked on the second oxide layer 13, and then is patterned, to complete gate electrodes 14.

In a manufacturing method of a CCD solid-state imaging device, which includes the above-stated method, it is possible to form an MOS transistor of a source follower circuit of the vertical CCD 2, the horizontal CCD 3, and the output amplifier 5, by forming the gate electrode 14 directly onto the second oxide layer 13. However, it is alternatively possible to form the gate electrode 14 after forming a silicon nitride layer over the second oxide layer 13 using a CVD (chemical vapor deposition) method.

Note that in the above explanation, the second oxide layer 13 is stated to have a larger layer thickness than that of the first oxide layer 12. However, even in a case where the first oxide layer 12 has a larger layer thickness than that of the second oxide layer 13, the present invention is still realized by addition of a step to perform etching to the first oxide layer 12 so as to reduce the layer thickness of the first oxide layer 12 to be smaller than the layer thickness of the second oxide layer 13. In addition, after the insulation layer forming step, it is desirable to refrain from performing an oxidation step as much as possible since oxidation will greatly change the impurity concentration distribution.

1-2. Advantages of the Present Embodiment

The advantages of a CCD solid-state imaging device resulting from the above-stated manufacturing method is described in comparison with a conventional CCD solid-state imaging device generated using a conventional method.

(1) Fluctuation Restraint of N-type Impurity Concentration Distribution in the Substrate 11

Figure 3A:
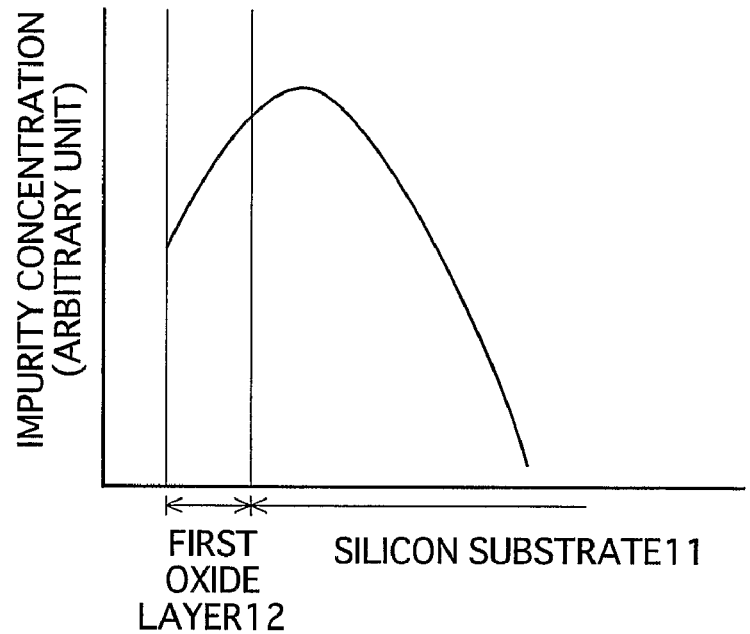
FIGS. 3A and 3B are for showing impurity concentration of n-well of a vertical CCD according to the first embodiment.
Figure 3B:
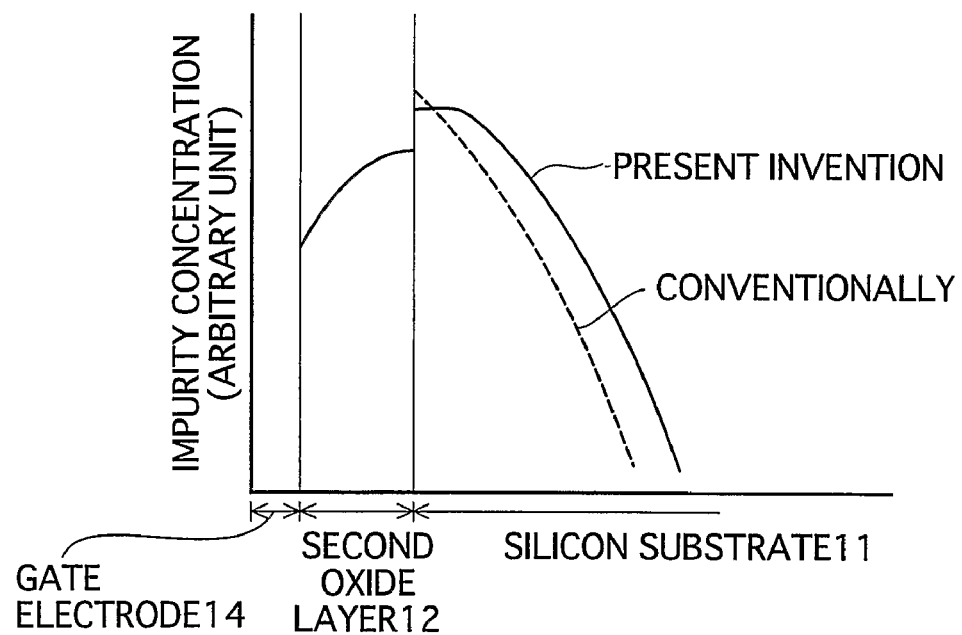

FIGS. 3A and 3B are diagrams drawn to compare the present embodiment and a conventional embodiment, in respect of an n-type impurity concentration distribution in the substrate 11. Specifically, FIG. 3A shows the concentration distribution subsequent to the ion implantation of the ion implantation step. As shown in FIG. 3A, the concentration distribution exhibits a continuous form between the substrate 11 and the first oxide layer 12. On the other hand, FIG. 3B shows the concentration distributions after the insulation layer forming step, where a solid-line graph relates to the present embodiment (indicated by "present invention" in the drawing), and a broken-line graph relates to a conventional embodiment (indicated by "conventionally" in the drawing).

As is clear from FIG. 3B, after the insulation layer forming step, the concentration distribution is discontinuous between the substrate 11 and the first oxide layer 12. FIG. 3B also indicates that the concentration distribution in the substrate 11 fluctuates in both of the present embodiment and the conventional embodiment after the insulation layer forming step in comparison with immediately after ion implantation (i.e. FIG. 3A). However it is known from FIG. 3B that the present embodiment experiences smaller fluctuation than the conventional embodiment, and better maintains the form of concentration distribution immediately after ion implantation. In other words, the present embodiment has a characteristic that deterioration of charge transfer performance of the buried channel formed by ion implantation is smaller than in the conventional embodiment.

The difference of the present embodiment with the conventional embodiment is the non-existence of a step of removing the first oxide layer 12 subsequent to the ion implantation step. In view of this, factors that incur large fluctuation of the concentration distribution are considered as follows:

1) As a characteristic of the dispersion of n-type impurity such as As and P (donor type), concentration increase due to segregation has occurred at the interface of the substrate 11.

Figure 17:
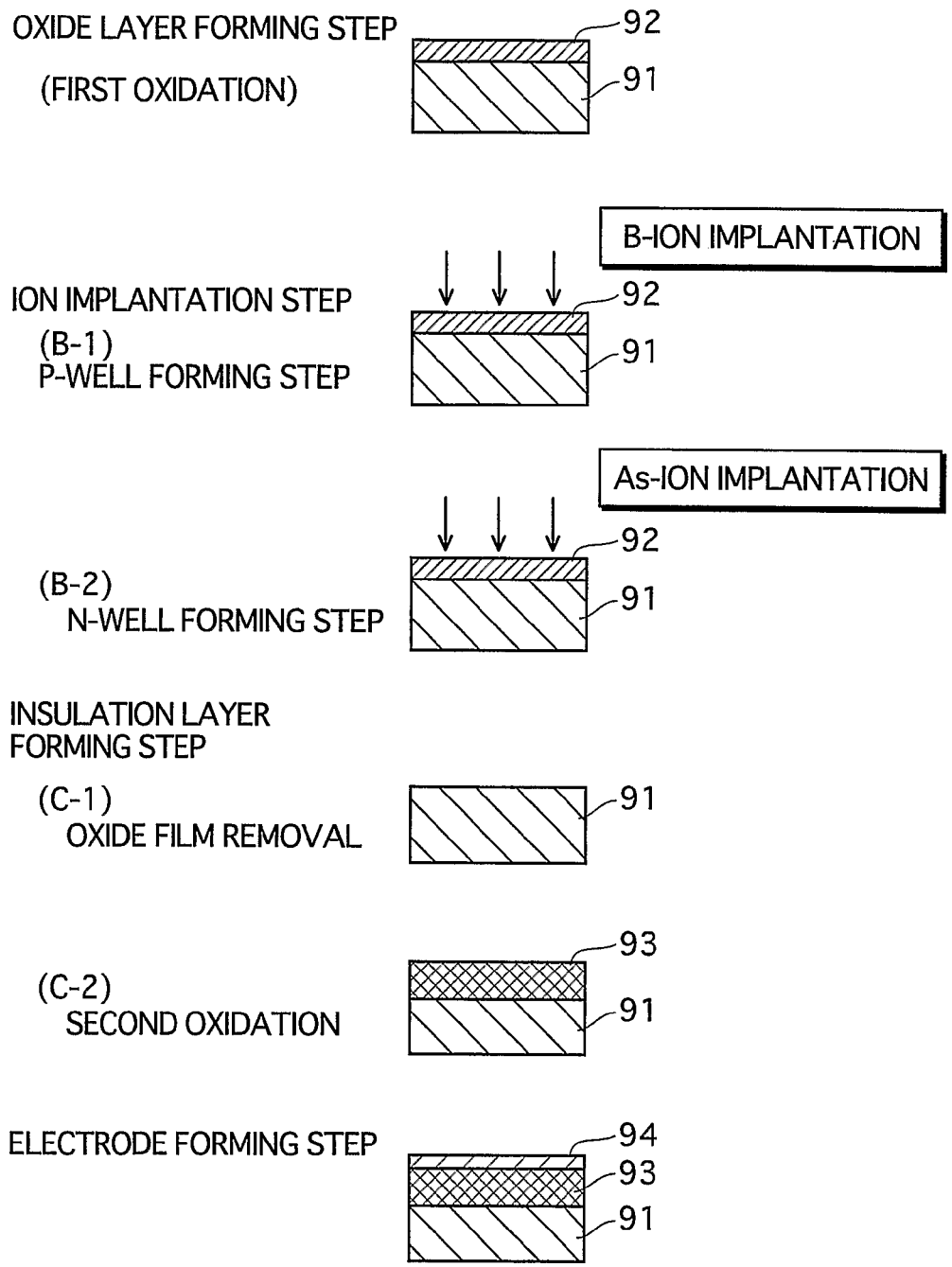
FIG. 17 is a schematic sectional diagram showing a manufacturing method of a conventional CCD solid-state imaging device.

2) When removing the first oxide layer 12, the surface of the substrate 11 is exposed outside (see "oxide layer removal" in "insulation layer forming step" of FIG. 17), thereby dispersing the n-type impurity having implanted within the substrate 11 towards outside.

3) After removal of the first oxide layer 12, retreat of the substrate's interface occurs due to oxidation newly performed on the exposed substrate 11, which is another contributing factor. Due to this oxidation, silicon crystal results in a thermal oxide layer having about twice as much volume as before, and the oxide layer is formed with about ½ of the oxide layer having the interface of the substrate 11 to retreat. As a result, the impurity concentration distribution after the ion implantation seems as if moved towards the surface of the substrate 11, from a relative point of view.

4) A still another factor is the movement of the impurity to inside the oxide layer. Because the second oxide layer does not originally contain any n-type impurity, and is generated in the high temperature condition of heat oxidation, much n-type impurity of the substrate 11 moves towards the second oxide layer so as to maintain the concentration balance between the interface concentration of the substrate 11 and the second oxide layer, as if being absorbed by the second oxide layer.

Because of the above factors of 1)-4), and the like, the concentration peak of the impurity concentration distribution within the silicon substrate becomes shallow, and the concentration in the interface of the substrate 11 is high but steeply decreases in the depth direction. Even if the energy of ion implantation is set high in advance, the distribution fluctuation as stated above cannot be avoided. This is not desirable because the n-well will be formed deeply, and the saturation characteristic of the vertical CCD decreases.

As opposed to this, in the present embodiment, removal of the first oxide layer 12 is not performed, and the re-oxidation (second oxidation) to form the second oxide layer 13 is performed in the subsequent ion implantation step with the first oxide layer 12 remaining. According to the present embodiment that performs the stated method, dispersion of the impurity from the substrate 11 towards outside is restrained because the surface of the substrate 11 is maintained unexposed.

In addition, with respect to the interface between the surface of the substrate 11 and the second oxide layer 13, some retreat will be caused compared to immediately after the formation of the first oxide layer 12. However the re-oxidation is performed to the first oxide layer 12 and not directly to the substrate 11, and so the retreat of substrate interface is restrained compared to a conventional embodiment.

Furthermore, in the conventional embodiment, a new layer formed to the substrate's surface does not at all contain impurity in the first place, and so is largely different in impurity concentration from the substrate 11. However in the present embodiment, the first oxide layer 12 will remain at the starting of the re-oxidation. Since the first oxide layer 12 contains a certain amount of the impurity as stated above, the resulting impurity concentration difference will be smaller than in the case of the conventional embodiment. Therefore although there is some increase in the n-type impurity concentration on the surface of the substrate 11 in the present embodiment, movement of the stated impurity towards the second oxide layer 13 is not actively performed in comparison with the conventional embodiment. As a result, the present embodiment is able to keep the change in impurity concentration distribution small.

In addition, in the conventional distribution, much impurity moves into the oxide layer, thereby reducing the impurity concentration and changing the concentration distribution steeply. The present embodiment alleviates this drawback too.

The example of Table 1 compares the present embodiment and the conventional embodiment, in respect of a combination of the first oxide layer thickness, the second oxide layer thickness, and ion implantation energy. Note that in Table 1, each value in parenthesis pertains to that of the conventional embodiment.

TABLE 1

| Ion type | Energy | First oxide layer thickness | Rp in substrate | Second oxide layer thickness |
| --- | --- | --- | --- | --- |
| P | 70 KeV (70 KeV) | 20 nm(30 nm) | 50 nm(50 nm) | 30 nm(50 nm) |
| As | 120 KeV (120 KeV) | 20 nm(20 nm) | 40 nm(40 nm) | 30 nm(30 nm) |

Figure 4A:
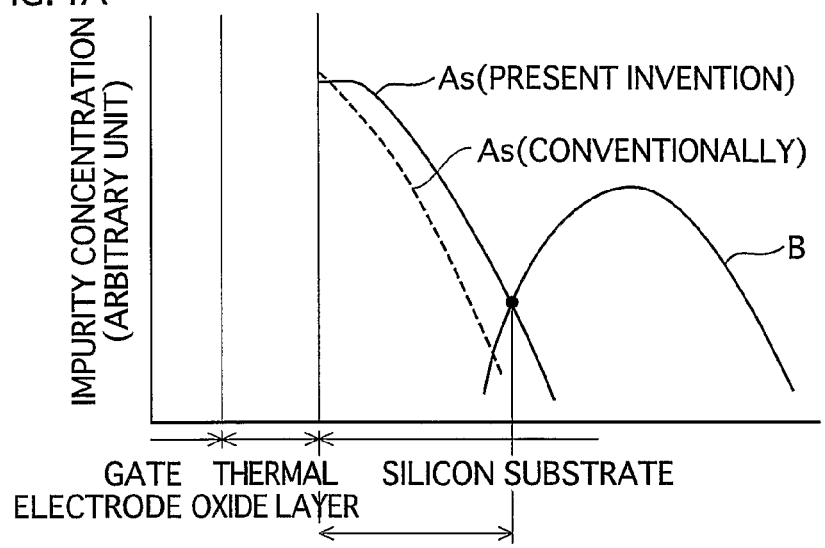
FIGS. 4A, 4B, and 4C are for showing an impurity concentration distribution, an electric field distribution, and a potential distribution of a vertical CCD according to the first embodiment.
Figure 4B:
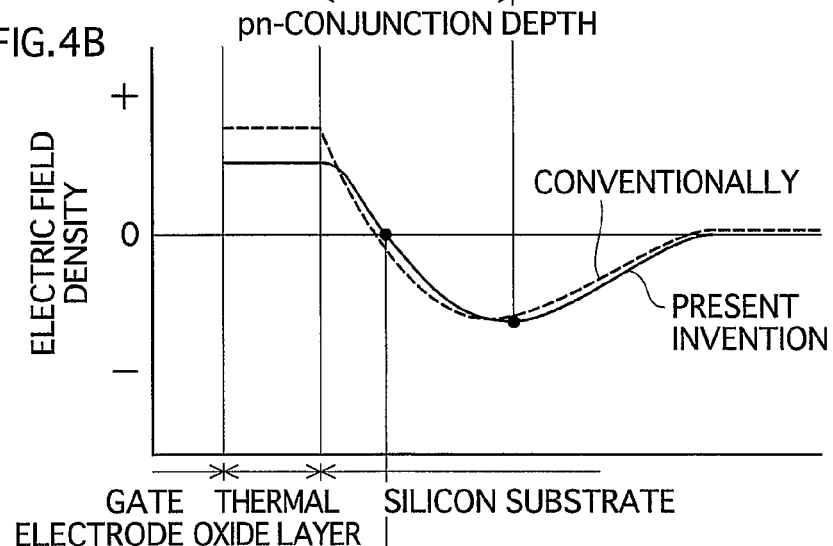
Figure 4C:
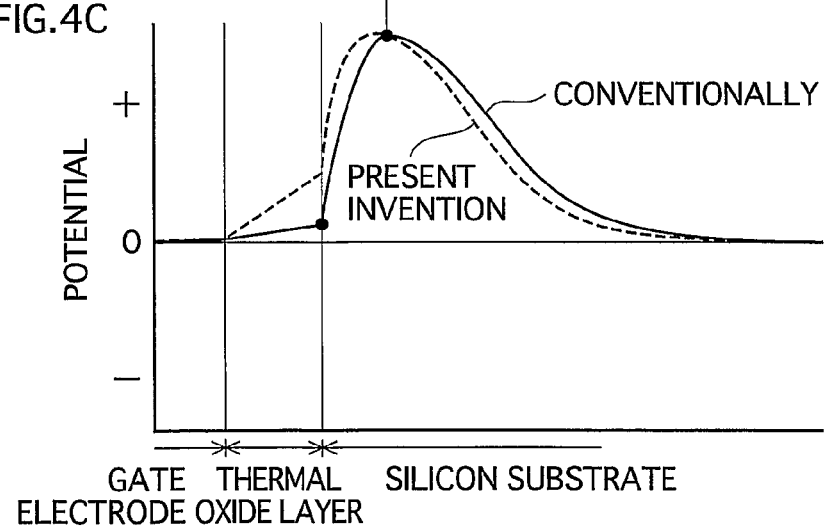

Fluctuation restraint of the concentration distribution is explained using FIGS. 4A-4C. FIG. 4A shows a concentration distribution of impurity in the substrate 11. FIG. 4B shows an electric field distribution of impurity in the substrate 11 and in the second oxide layer 13, which is based on FIG. 4A. FIG. 4C shows a potential distribution in the substrate 11 and in the second oxide layer 13, which is based on FIG. 4B. FIG. 4A shows the concentration distribution of n-type impurity (As) in a schematic representation created based on the result of SIMS (Secondary Ion-microprobe Mass Spectrometer) analysis actually performed. For convenience, FIG. 4A also shows a concentration distribution of B in the p-well. In addition, such a state is assumed in which 0V is applied to the gate electrode and to the p-well where complete depletion has been achieved from the surface of the substrate 11 to a certain depth after all signal charge has been transferred out by charge transfer. Note that in each of FIGS. 4A-4C, a broken-line graph is drawn to show a conventional distribution, for comparison purpose.

As in FIG. 4A, fluctuation of n-type impurity is restrained as stated above. Accordingly, in the present embodiment, the pn conjunction is deeper than in the conventional embodiment.

FIG. 4B is obtained by a simple integral operation and the continuity condition, using the impurity concentration distribution of FIG. 4A. As shown in FIG. 4B, the electric field density takes the minimum value at the pn conjunction. Note that as stated above, the present embodiment is able to restrain reduction of impurity concentration in the substrate 11, and so has a different impurity concentration distribution from that of the conventional embodiment. Accordingly, the peak potential of the present embodiment will be different from the peak potential of the conventional embodiment. However, for enabling operation in the same driving voltage as in the conventional embodiment, the present embodiment should maintain the peak potential at the same level as in the conventional embodiment. So as to deal with this need, the implantation amount of impurity in the present embodiment has to be reduced to set the electric field density at the surface smaller than in the conventional embodiment.

FIG. 4C shows a potential distribution obtained from the electric field density distribution of FIG. 4B. The potential takes the maximum value where the electric field indicates 0. The potential distribution in the present embodiment takes the maximum value at a position of the substrate 11 that is deeper than that of the conventional embodiment, however indicates substantially the same peak potential as that of the conventional embodiment. As a result, the potential gradient in the second oxide layer 13 is smaller for the present embodiment than for the conventional embodiment. Accordingly, the potential on the surface of the substrate 11 is smaller for the present embodiment than for the conventional embodiment. In other words, in the present embodiment, the charge transfer portion of the buried channel will have a larger saturated charge amount than in the conventional embodiment, and will be less subject to charge accumulation at the surface of the substrate 11 than in the conventional embodiment.

Figure 5:
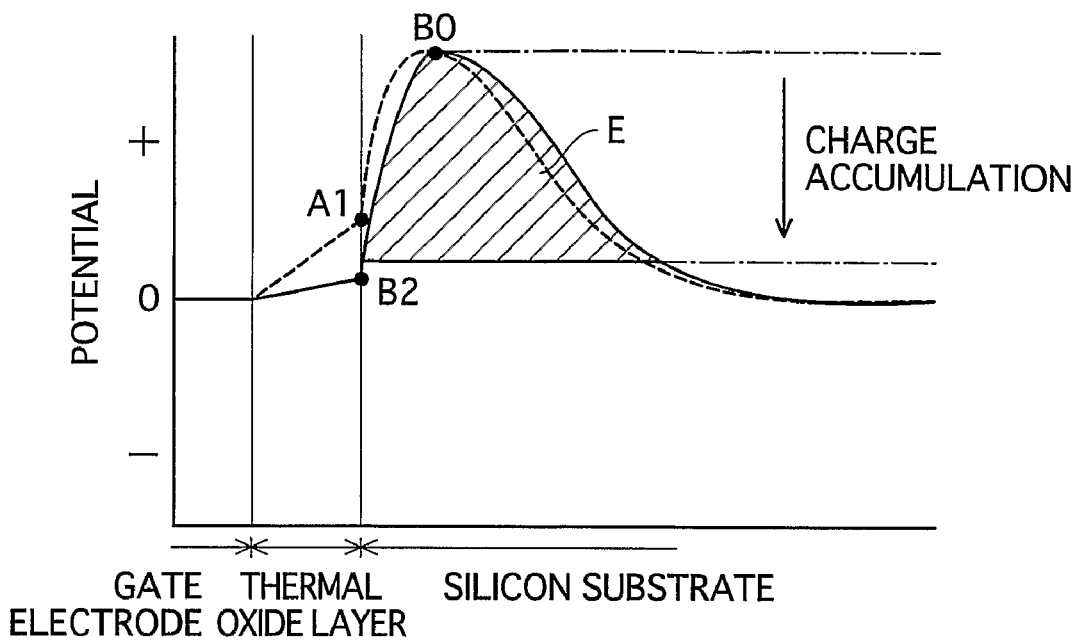
FIG. 5 is a schematic diagram showing a potential distribution under a state where the vertical CCD has a signal charge accumulation according to the first embodiment.

Therefore, even if signal charge is accumulated almost up to a saturated level in the present embodiment, the signal charge will not overflow onto the surface of the substrate 11, and so an ideal buried channel is realized. For example, FIG. 5 schematically illustrates a state in which signal charge is accumulated in the vertical CCD 2 of the present embodiment. Note that in this drawing, too, a potential distribution of the conventional embodiment is shown as a broken-line graph.

In the present embodiment, even if signal charge is accumulated almost up to a saturated level (oblique portion E in the drawing), the signal charge will not overflow onto the surface of the substrate 11. Note that the signal charge is accumulated in the direction of the arrow in FIG. 5. As a result, even if the vertical CCD 2 repeats electric field transfer, the signal charge vanish at the surface of the substrate 11 will not occur, and so signal amount reduction is restrained even if there is phase increase of the charge transfer as in FIG. 6.

Figure 6:
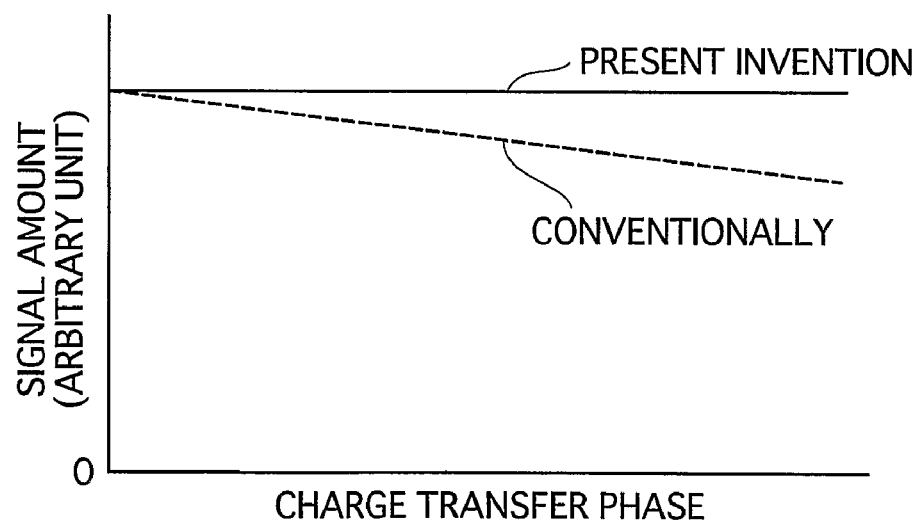
FIG. 6 is a schematic diagram showing a relation between the charge transfer phases and reduction in signal amount for the vertical CCD according to the first embodiment.

On the other hand, in the conventional embodiment, if signal charge accumulation exceeds the point A1 (See FIG. 5), signal charge disperses onto the surface of the substrate 11, which means that loss of the signal charge amount increases as the increase in charge transfer phase (see the broken-line graph of FIG. 6).

Figure 7B:
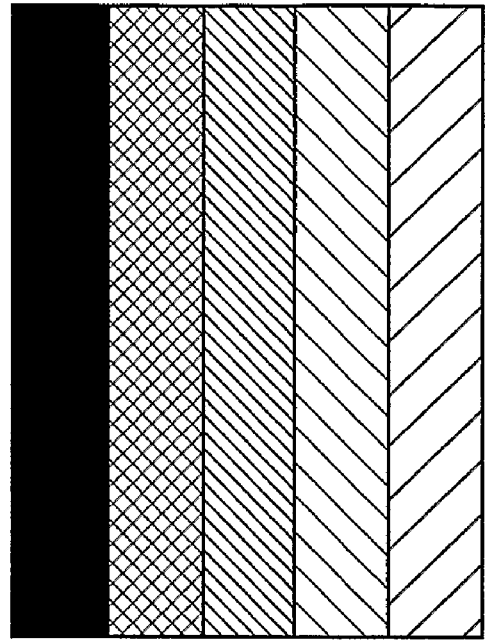
FIG. 7B is a schematic diagram showing one example of the image photographed using the conventional solid-state imaging device.
Figure 7A:
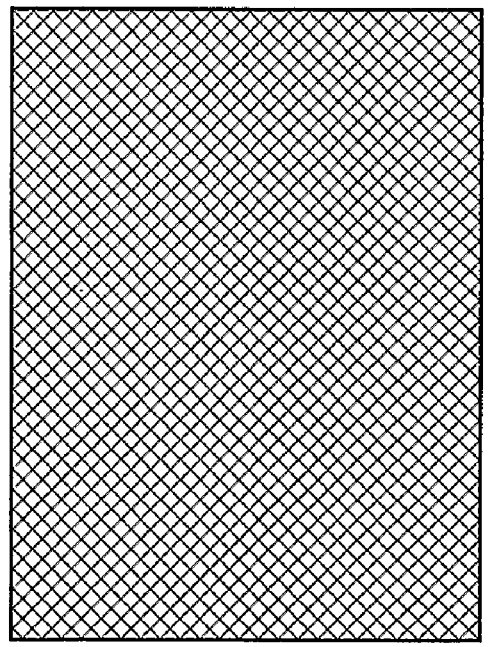
FIG. 7A is a schematic diagram showing one example of the image photographed using the first embodiment.

In the conventional embodiment, if signal loss occurs during signal transfer, so-called shading and color shift have occurred, impairing generation of a favorable image. However, in the present embodiment (See FIG. 7A), loss of transfer charge is restrained, thereby allowing the resulting image to obtain uniform chromaticity and illuminance. Note that as shown in the image schematic diagram of FIG. 7B, the shading is a phenomenon in which chromaticity and illuminance gradually decrease in the vertical charge transfer direction even if actual photographing has been performed with a uniform illuminance.

As explained above, according to the manufacturing method of the present embodiment, it is possible to realize a CCD solid-state imaging device capable of restraining fluctuation of the impurity concentration distribution and achieving a favorable charge transfer performance.

Note that in the present embodiment, if ion in the same amount as in the conventional embodiment is implanted, the second oxide layer 13 contains n-type impurity already at the time of re-oxidation. This makes the present embodiment to have more n-type impurity after the insulation layer forming step than in the conventional embodiment. As a result, the maximum value of potential (FIG. 4C) will not be the same between the present embodiment and the conventional embodiment. However, the ion implantation amount may be adjusted to yield the same maximum value.

In addition, the desirable accelerating energy of ion implantation is obtained when the implantation range (Rp) in the substrate 11 is in the range of 1 to 2 times the layer thickness of the second oxide layer 13. When the implantation range (Rp) becomes smaller than the layer thickness of the second oxide layer 13, effects from the impurity movement and from the segregation become large, thereby reducing the entire impurity concentration to impair the desired characteristic. On the contrary, if the implantation range (Rp) becomes larger than twice the layer thickness of the second oxide layer 13, the impurity concentration peak becomes too deep and the dispersed amount of the impurity in the lengthwise direction at the time of ion implantation enlarges, which is not suitable for obtaining high pixel densities.

In addition, the p-well forming step is not necessarily performed subsequent to the oxide layer forming step (first oxide layer forming), as long as it is performed before the step of forming the gate electrode 14 ("electrode forming step in FIG. 2"). This is because B is ion-implanted with accelerated energy of 100 KeV-300 KeV, and in the dope amount of about $1 \times 10^{12}$ cm$^{-2}$--$3 \times 10^{12}$ cm$^{-2}$ in recent years. If using this formula, the implantation range will be sufficiently larger than the layer thickness of the first oxide layer 12 and of the second oxide layer 13, and so the concentration distribution of the p-well formed by B implanted using the formula is substantially the same as long as the p-well forming step is performed before the electrode forming step.

(2) Other Advantage

The manufacturing method of the present embodiment is able to achieve other advantages than the one stated in the former section (1).

The manufacturing method of the present embodiment is characterized by performing re-oxidation subsequent to the ion implantation step, and without removing the first oxide layer 12. This helps maintain the impurity concentration distribution within the substrate 11. However performance of the ion implantation via the first oxide layer 12 causes damage to the Si—O combination within the first oxide layer 12. Mainly due to this damage, the layer characteristic of the first oxide layer 12 deteriorates. If such a first oxide layer 12 is employed as a gate insulation layer as it is, the deteriorated layer characteristic will cause many failures such as gate leak and withstand voltage reduction. This is one reason for completely removing the first oxide layer 12 and replacing it with a new oxide layer in the conventional embodiment. In the present embodiment, however, the re-oxidation recovers the damage in the oxygen atmosphere, enabling the resulting second oxide layer 13 to obtain a favorable crystalline structure throughout the entire area. In addition, the interface between the substrate 11 and the first oxide layer is also oxidized, thereby curing the layer characteristics deterioration and the interface damage caused by the ion implantation. Therefore, the manufacturing method of the present embodiment is able to generate a gate insulation layer (second oxide layer 13) having the same quality as that of the conventional example.

In addition, with the conventional embodiment, it is impossible to obtain the desired signal saturation amount due to the fluctuation of the impurity concentration distribution within the silicon substrate 11. To counter this, it is possible to implant the amount of impurity that takes into account the fluctuation in advance. However in this case, the crystalline in the silicon substrate 11 will be subjected to damage in proportion to the implanted amount of impurity, thereby deteriorating the dark period characteristics of the CCD such as white spot defect and dark current noise. Use of the manufacturing method of the present invention enables to restrain the fluctuation of the impurity concentration distribution. Accordingly, the dark period characteristics is also restrained from deteriorating, thereby obtaining the saturation signal amount that is best suited for the implantation amount of impurity with respect to the silicon substrate 11.

Note that in the present embodiment, after the n-well of the vertical CCD 2 is formed by ion implantation, the n-well is subjected to the second oxidation. If the second oxidation is a step that performs oxidation in connection with annealing under high temperature of 950° C. or above, it also serves the purpose of recovering the crystalline damage of the substrate 11 caused due to ion implantation during the n-well forming step.

It is possible to achieve the same advantage if the annealing under high temperature of 950° C. or above is performed after the formation of n-well by means of ion implantation, independent of the second oxidation. However in this case, it is desirable to perform re-oxidation (second oxidation) performed thereafter under the temperature of 950° C. or below so as to prevent large fluctuation of the impurity distribution.

SECOND EMBODIMENT

As follows, an embodiment different from the first embodiment is described. The present embodiment (second embodiment) is different from the first embodiment only in respect of manufacturing of the output amplifier. Accordingly, explanation of the other portions of the manufacturing method is omitted.

Figure 8:
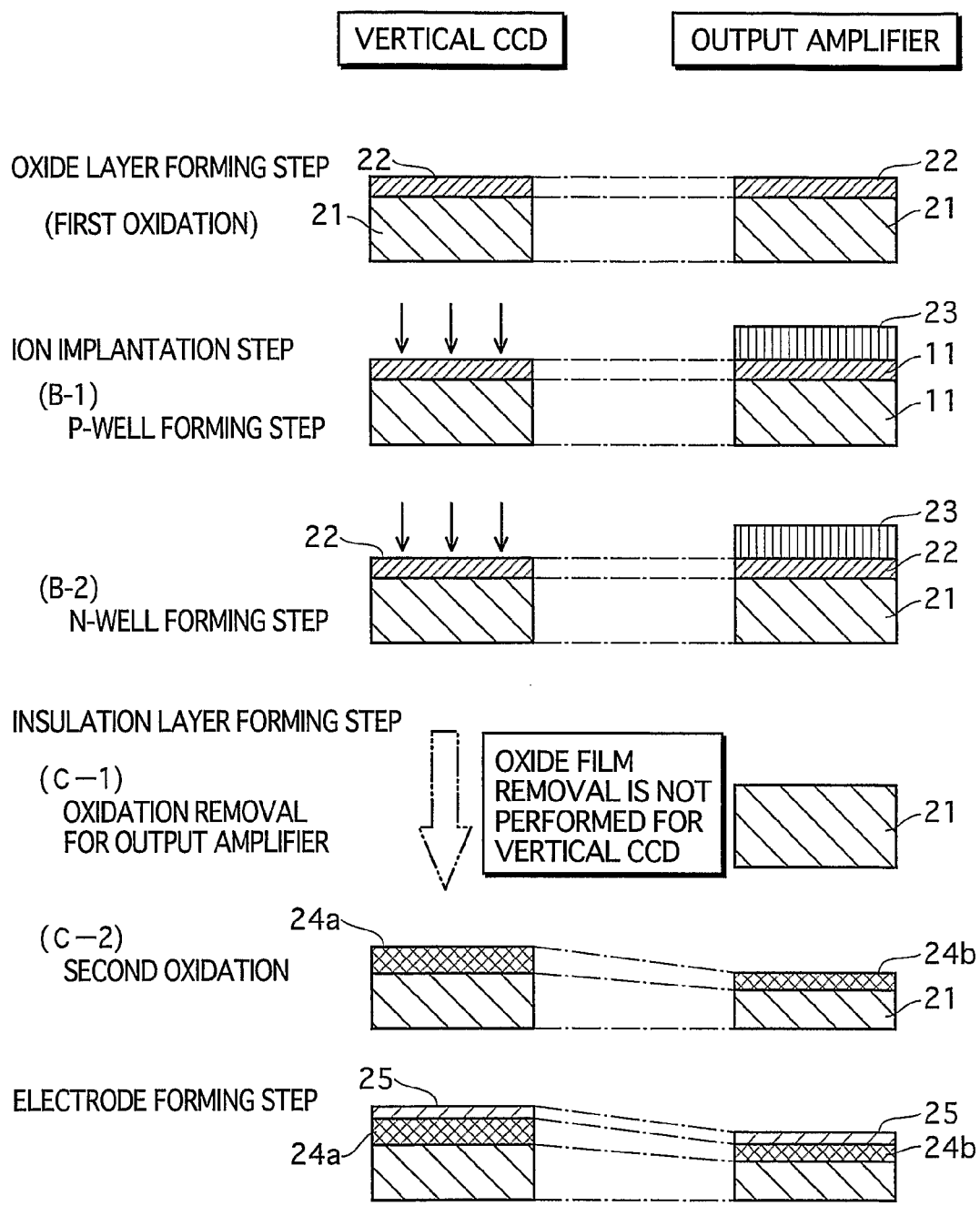
FIG. 8 is a schematic sectional diagram showing a manufacturing method of a vertical CCD and an output amplifier, according to the second embodiment.

FIG. 8 is a schematic sectional diagram drawn to explain the manufacturing method of the CCD solid-state imaging device according to the present embodiment (from "oxide layer forming step" to "electrode forming step"). The characteristics of the present embodiment lies in inclusion of, between the ion implantation step and the re-oxidation step (second oxidation), a step of removing only part of the first oxide layer 22 which corresponds to the output amplifier 5.

First, the oxide layer forming step ("oxide layer forming step" in FIG. 8) through the ion implantation step ("ion implantation step" in FIG. 8) are performed.

In the insulation layer forming step, the vertical CCD and the horizontal CCD are masked by means of photoresist and the like, to remove only part of the first oxide layer 22 that corresponds to the output amplifier 5. During this operation, part of the first oxide layer 22 that corresponds to the vertical CCD is not removed just as in the case of the first embodiment.

Next, just as in the first embodiment, re-oxidation is performed under a certain oxygen atmosphere, thereby forming the second oxide layers 24a and 24b. As a result of this operation, a desired oxide layer thickness is obtained in combination with the first oxide layer 22, with respect to the vertical CCD and the horizontal CCD.

After the steps described above, a conductive layer made of polysilicon and the like is stacked on the second oxide layer, and then is patterned, to complete a gate electrode 25.

Table 2 shows an example of the oxide layer thickness for each of the portions described above, in the present embodiment.

TABLE 2

|  | Vertical charge transfer portion | Horizontal charge transfer portion | Output amplifier |
| --- | --- | --- | --- |
| After 1st oxidation | 20 nm | 20 nm | 20 nm |
| Before 2nd oxidation | 20 nm | 20 nm | 0 nm |
| After 2nd oxidation | 30 nm | 30 nm | 20 nm |

According to the present embodiment described above, the vertical CCD and the horizontal CCD achieve the same charge transfer effect as in the first embodiment.

Further to this effect, the present invention is able to obtain the layer thickness of the gate insulation layer (second oxide layer) 24b to be different from the layer thickness of the gate insulation layer (second oxide layer) 24a, where the second oxide layer 24b pertains to the MOS transistor of the source follower circuit of the output amplifier, and the second oxide layer 24a pertains to the vertical CCD (the horizontal CCD). The present embodiment is able to generate a gate insulation layer (second oxide layer) having an optimal layer thickness for an output amplifier, leading to formation of an output amplifier of a high quality. In particular, if the first-level transistor of the source follower circuit is made to have a thin gate insulation layer, the frequency characteristics will improve to allow high-speed operation of a CCD solid-state imaging device, and further to realize high pixel densities by utilizing a CCD solid-state imaging device. This will lead to achievement of favorable imaging characteristics.

Note that in the present embodiment, removal of the first oxide layer 22 is performed subsequent to the ion implantation step ("ion implantation step" in FIG. 8), but the order may be changed as long as the removal of the first oxide layer 22 is performed after the oxide layer forming step (first oxidation) and before the second oxidation step of the insulation layer forming step.

In addition, for the purpose of endowing the output amplifier with a gate insulation layer (second oxide layer) 24b having a desired layer thickness, it is not always necessary to completely remove the part of the first oxide layer 22 that corresponds to the output amplifier. It is alternatively possible to reduce the layer thickness of the corresponding part of the first oxide layer 22, by means of etching and the like. Still alternatively, it is possible to perform the oxide layer removal only directed to part of the output amplifier, thereby having a structure in which the gate insulation layer thickness is different among a plurality of transistors constituting the source follower circuit.

THIRD EMBODIMENT

Next, an embodiment different from the first and second embodiments is described. In respect of the present embodiment, the difference with the first and second embodiments is mainly discussed.

Figure 9:
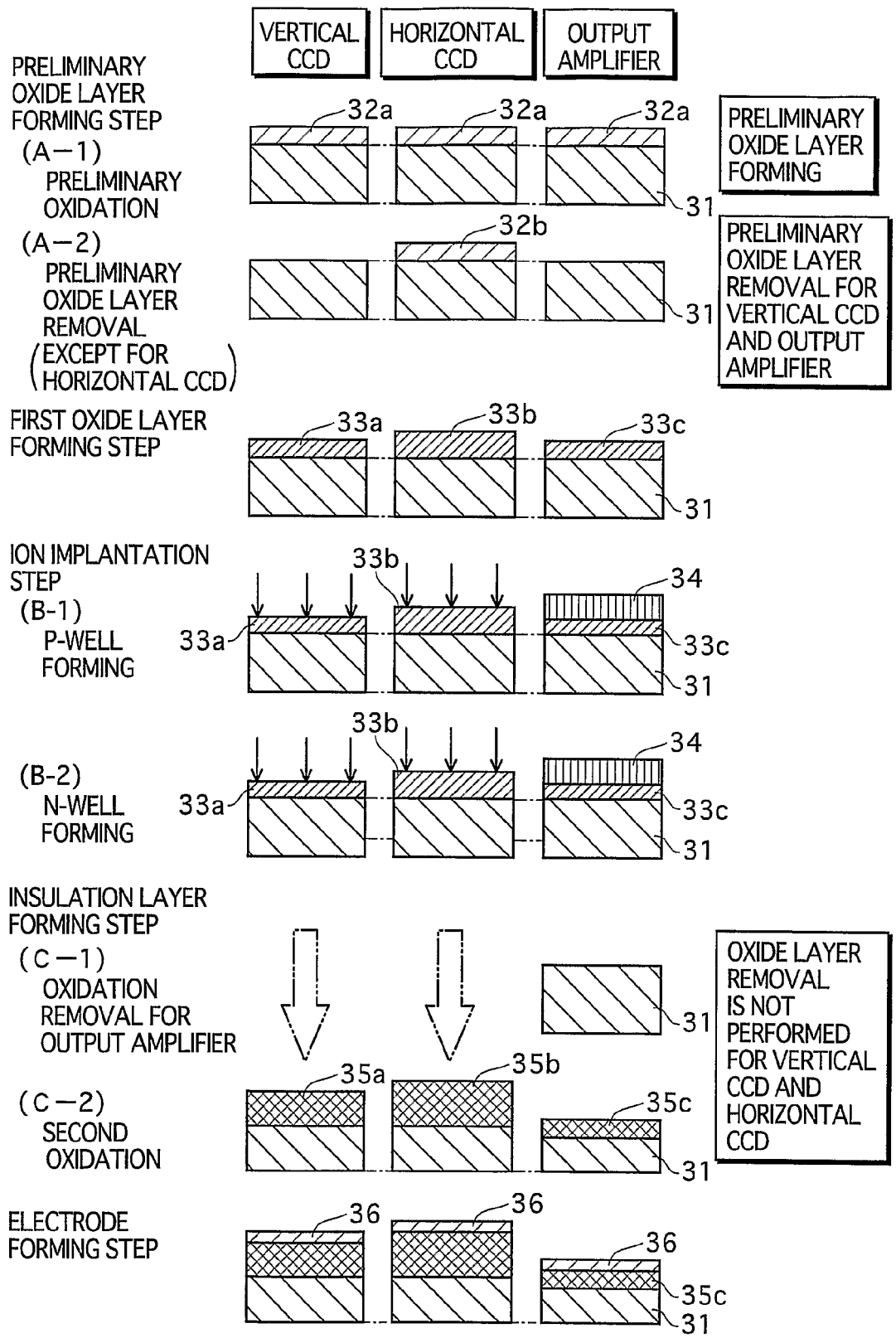
FIG. 9 is a schematic sectional diagram showing a manufacturing method of a solid-state imaging device according to the third embodiment.

FIG. 9 is a schematic sectional diagram showing the manufacturing method of the present embodiment (from "preliminary oxide layer forming step" to "electrode forming step").

In the present embodiment, the preliminary oxide layer forming step ("preliminary oxide layer forming step in FIG. 9") is performed prior to the oxide layer forming step. In this step, preliminary oxide layers 32a, 32b, and 32c, each having a predetermined layer thickness, are formed on a substrate 31 (see "preliminary oxidation" in FIG. 9). Then the preliminary oxide layers 32a and 32c, which respectively correspond to the vertical CCD and the output amplifier, are removed (See "preliminary oxide layer removal" in FIG. 9). Note that the preliminary oxide layers 32a, 32b, and 32c may be formed by a CVD method and the like, instead of the preliminary oxidation step.

Next, with the preliminary oxide layer 32b remaining at the horizontal CCD, the oxide layer forming step ("first oxide layer forming step" in FIG. 9) and the ion implantation step ("ion implantation step" in FIG. 9) are performed, as in the first embodiment. After these steps, the resulting first oxide layer 33b for the horizontal CCD will have a larger layer thickness than the other first oxide layers 33a and 33c, because of having undergone the first oxidation with the preliminary oxide layer 32b. In addition, in the ion implantation step of FIG. 9, the implantation range (Rp) of the n-type impurity is set larger than the layer thicknesses of the first oxide layers 33a, 33b, and 33c, and the peak of the n-type impurity concentration distribution is set to fall within the substrate 31.

In the insulation layer forming step following the ion implantation step, the first oxide layer 33c of the output amplifier is removed, with the vertical CCD and the horizontal CCD being masked by means of the photoresist and the like ("oxidation removal for output amplifier" in FIG. 9).

Then, re-oxidation (second oxidation) is performed at a certain oxygen atmosphere, with the first oxide layer 33a and the first oxide layer 33b remaining for the vertical CCD and the horizontal CCD ("second oxidation" in FIG. 9). As a result, for the vertical CCD, a predetermined layer thickness of an oxide layer is obtained in combination with the first oxide layer 33a.

At the same time, for the horizontal CCD, a predetermined layer thickness of the second oxide layer 35b is obtained in combination with the preliminary oxide layer 32b and the first oxide layer 33b. For example, with respect to the substrate 31 already provided with the preliminary oxide layer 32b having a layer thickness of 20 nm, oxidation of 20 nm is performed, thereby obtaining the first oxide layer 33b having a layer thickness of about 30 nm. Further to the substrate 31 provided with the first oxide layer 33b, oxidation of 20 nm is performed, thereby obtaining the second oxide layer 35b having a layer thickness of about 40 nm. As for the output amplifier, the first oxide layer has been removed, and so only the second oxidation forms the oxide layer of the output amplifier. Therefore, it is needless to say that the oxide layer thickness is thinner for the output amplifier than for the vertical CCD or for the horizontal CCD.

After the steps described above, a conductive layer made of polysilicon and the like is stacked onto each second oxide layer, and then is patterned, to complete the gate electrode 36.

Table 3 shows an example of the oxide layer thickness transition for each of the portions described above, in the present embodiment. According to the present embodiment, the oxide layer is thicker for the horizontal CCD than for the vertical CCD.

TABLE 3

|  | Vertical charge transfer portion | Horizontal charge transfer portion | Output amplifier |
| --- | --- | --- | --- |
| After preliminary oxidation | 20 nm | 20 nm | 20 nm |
| Before first oxidation | 0 nm | 20 nm | 0 nm |
| After first oxidation | 20 nm | 30 nm | 20 nm |
| Before second oxidation | 20 nm | 30 nm | 0 nm |
| After second oxidation | 30 nm | 40 nm | 20 nm |

3-2. Advantages of the Present Embodiment

The present embodiment is able to obtain, with respect to the vertical CCD, an impurity concentration distribution and a gate insulation layer thickness that are the same as those of the first embodiment. With respect to the output amplifier too, the present embodiment is able to obtain an impurity concentration distribution and a gate insulation layer thickness that are the same as those of the second embodiment. Therefore the present embodiment is able to obtain the same effects as those of the first and second embodiments.

Figure 10A:
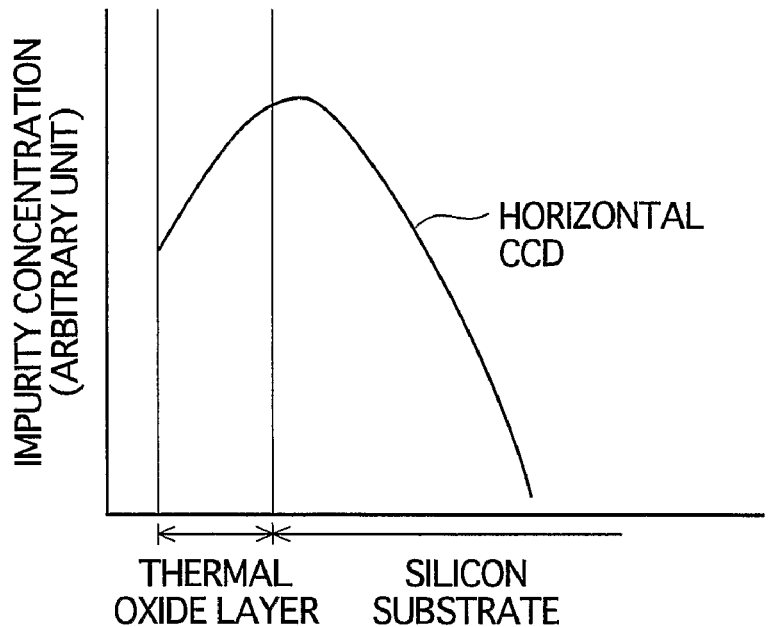
FIGS. 10A and 10B are diagrams for showing an impurity concentration distribution diagram of n-well for a horizontal CCD according to the third embodiment.
Figure 10B:
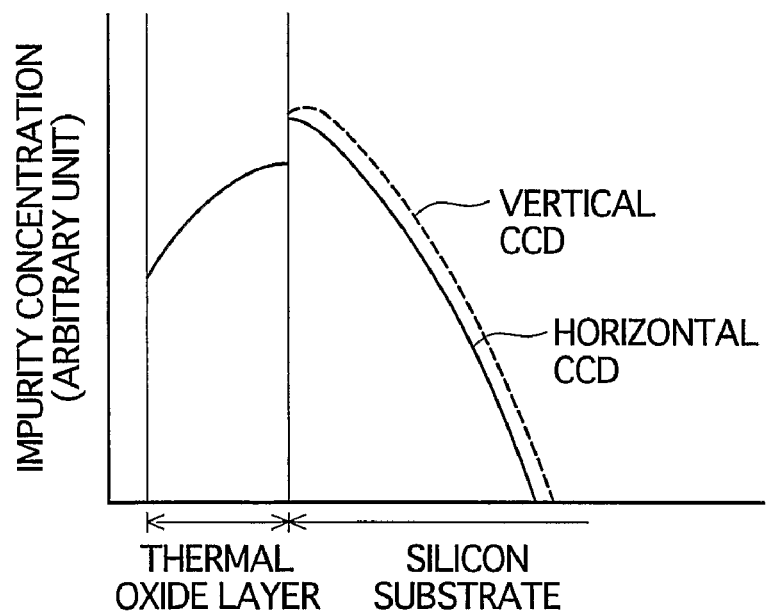
Figure 11A:
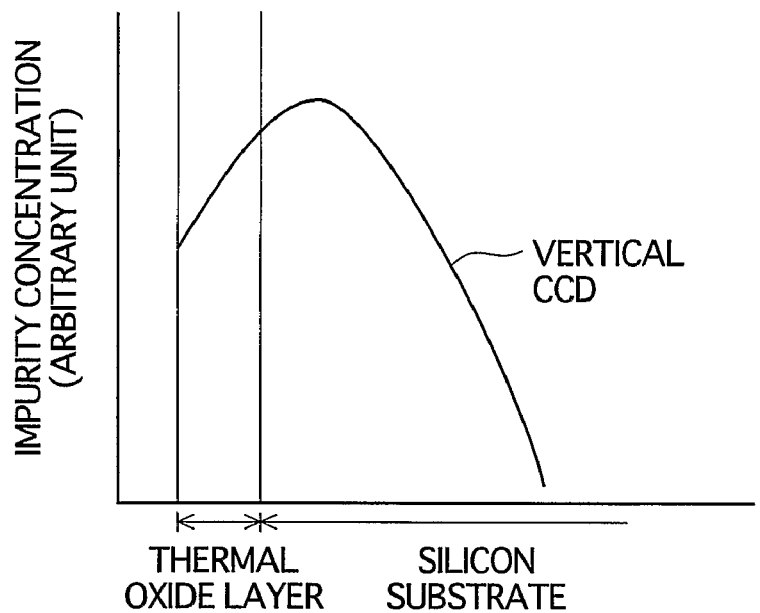
FIGS. 11A and 11B are diagrams for showing an impurity concentration distribution diagram of n-well for a vertical CCD according to the third embodiment.
Figure 11B:
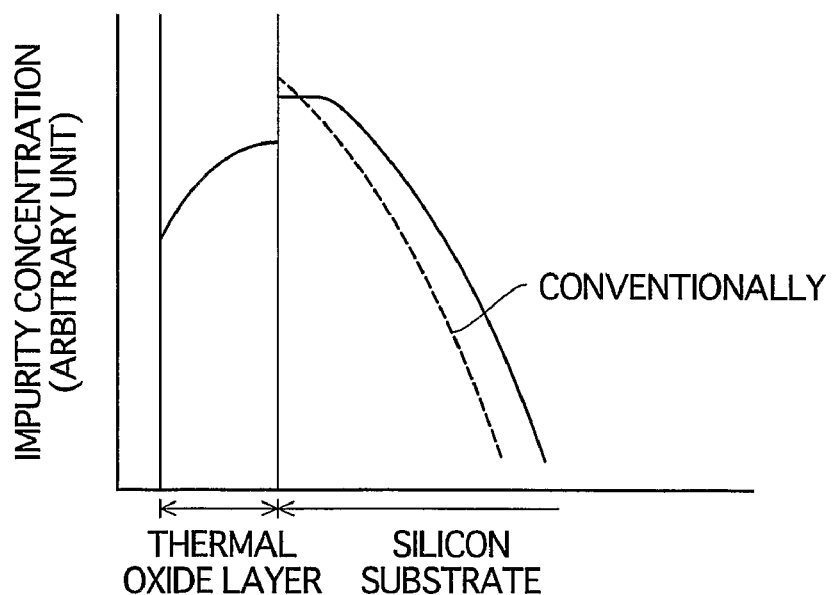

In addition, the present embodiment is able to obtain the following effect with respect to the horizontal CCD. The effect is detailed as follows using FIGS. 10A, 10B, 11A, and 11B. FIGS. 10A and 10B are diagrams for showing an n-type impurity concentration distribution for the horizontal CCD, and FIGS. 11A and 11B are diagrams for showing an n-type impurity concentration distribution for the vertical CCD. Each of FIGS. 10A and 11A shows a corresponding n-type concentration distribution in the ion implantation step, and each of FIGS. 10B and 11B shows a corresponding n-type concentration distribution after the insulation layer forming step. Note that for convenience purpose, FIG. 10B also shows an n-type impurity concentration distribution for the vertical CCD as a broken-line graph, and FIG. 11B also shows an n-type impurity concentration distribution for the conventional vertical CCD as a broken-line graph.

3-2-1. Advantages of the Potential Depth of the Horizontal CCD

According to the manufacturing method of the present embodiment, the horizontal CCD is subjected to ion implantation via the oxide layer 33b that is thicker than that of the vertical CCD (see "ion implantation step" of FIG. 9). Therefore, with respect to the horizontal CCD, the implantation range Rp in the substrate 31 becomes small, and in particular, the n-type impurity concentration becomes small compared to the counterpart for the vertical CCD (See FIGS. 10A and 11A). The same thing regarding the n-type impurity concentration holds true for the horizontal CCD and the vertical CCD after the insulation layer forming step (See FIG. 10B).

Figure 12:
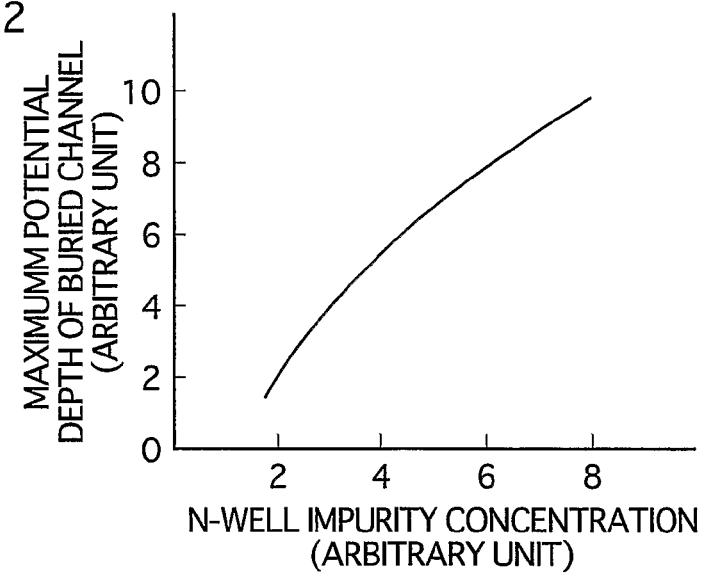
FIG. 12 is a diagram showing dependence, on an n-type impurity concentration, of a potential depth of a buried channel during depletion, relating to the third embodiment.

As shown in FIG. 12, a buried channel has a characteristic that the maximum potential depth increases with the increase in n-type impurity. However the present embodiment is able to restrain the impurity concentration for the horizontal CCD small compared to the conventional cases, while realizing simultaneous formation of the horizontal CCD and the vertical CCD under the optimal implantation condition for the vertical CCD as stated above. Accordingly, the potential depth for the horizontal CCD is restrained from becoming unnecessarily large.

Figure 13:
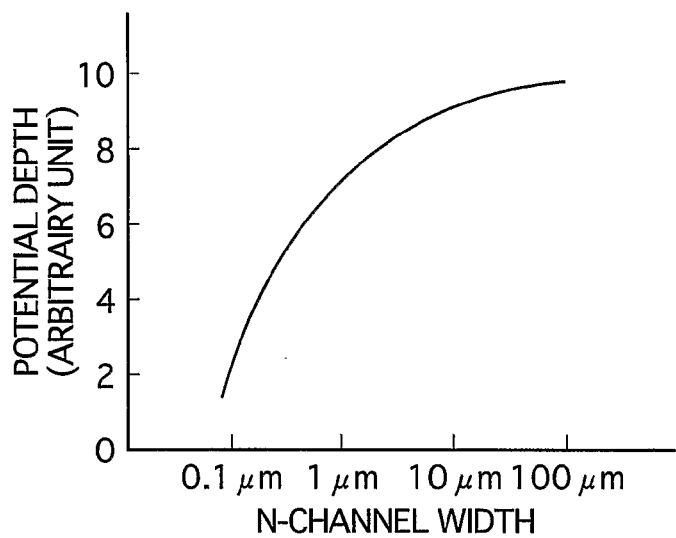
FIG. 13 is a diagram showing dependence, on a channel width, of a potential depth of a buried channel during depletion, relating to a CCD solid-state imaging device.

In particular, as pixels for a CCD solid-state imaging device become finer, the channel width of the vertical CCD becomes smaller than 1 μm, while the channel width of the horizontal CCD becomes about tens of μm, or hundreds of μm. As shown in FIG. 13, a buried channel has such a characteristic that the potential depth becomes large with the enlargement of the channel width. In view of this characteristic, if the horizontal CCD has a too large channel width as stated above, the horizontal CCD will have a much too larger potential depth than the potential depth for the vertical CCD. Therefore, a high power source voltage is required to achieve high potential for signal charge ejection drain after change detection. In the present embodiment, however, the potential depth of the horizontal CCD will not becomes so large, and so not so large power source voltage will be necessary. Therefore the present embodiment does not necessitate increase of the application voltage to the reset drain (not illustrated in the drawing), or additional implantation of B and the like to the n-well that would be necessary for lowering the n-well's effective concentration. In addition, the present embodiment is also able to avoid increase in number of steps such as B-ion implantation, with respect to the n-well having been formed using the As-ion implantation which is adopted to lower the effective carrier concentration of the horizontal CCD.

In addition, it is usually difficult to simultaneously obtain an optimal gate insulation layer thickness for a vertical CCD and an optimal gate insulation layer thickness for a horizontal CCD. This is because the optimal gate insulation layer thickness is different therebetween because a vertical CCD is required to maintain a saturated charge amount with a minute width, and a horizontal CCD is required to achieve high transfer efficiency as well as high transfer speed. However, with the manufacturing method of the present embodiment, it becomes possible to enable the horizontal CCD or the transistor of the output amplifier to achieve an adequate gate insulation layer thickness for themselves while performing the optimal ion implantation for the vertical CCD to achieve finer pixels.

3-2-2. Advantages of the Charge Transfer Efficiency for the Horizontal CCD

Improvement of the transfer efficiency of the horizontal CCD is an extremely important issue, because the horizontal CCD is operated with a clock of frequency 100 times higher than that of the vertical CCD. According to the present embodiment, the insulation layer of the horizontal CCD is made thicker than the insulation layer of the vertical CCD. This results in the following effect in respect of the transfer efficiency of the horizontal CCD.

Figure 14:
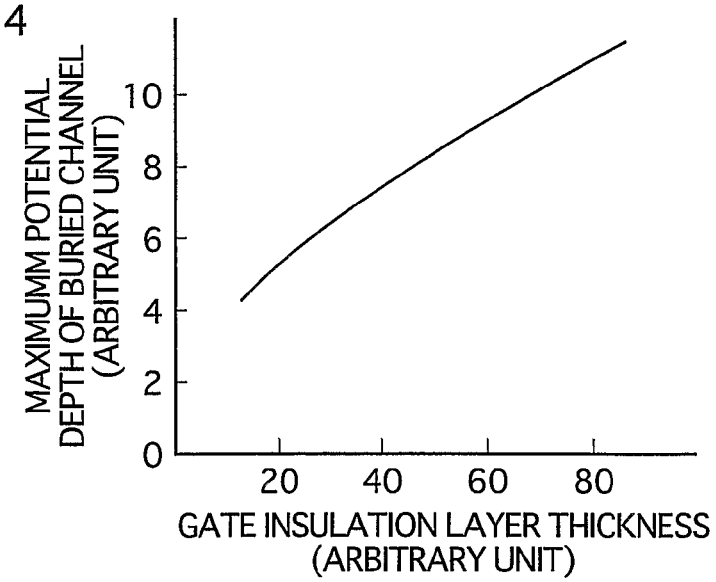
FIG. 14 is a diagram showing dependence, on a gate insulation layer thickness, of a potential depth of a buried channel during depletion, relating to a solid-state imaging device of the third embodiment.

As follows, consideration of the layer thickness of the gate insulation layer (second oxide layer) is set forth using FIG. 14. FIG. 14 shows dependence, on a gate insulation layer thickness, of a maximum potential depth of a buried channel during depletion. The gate insulation layer of the horizontal CCD has a larger potential depth than that of the vertical CCD. When voltage is applied to the gate electrode of the horizontal CCD, potential change extends in the transfer direction. However in the present embodiment, the degree of extension of the potential change becomes larger, because of the thickened gate insulation layer.

Figure 15A:
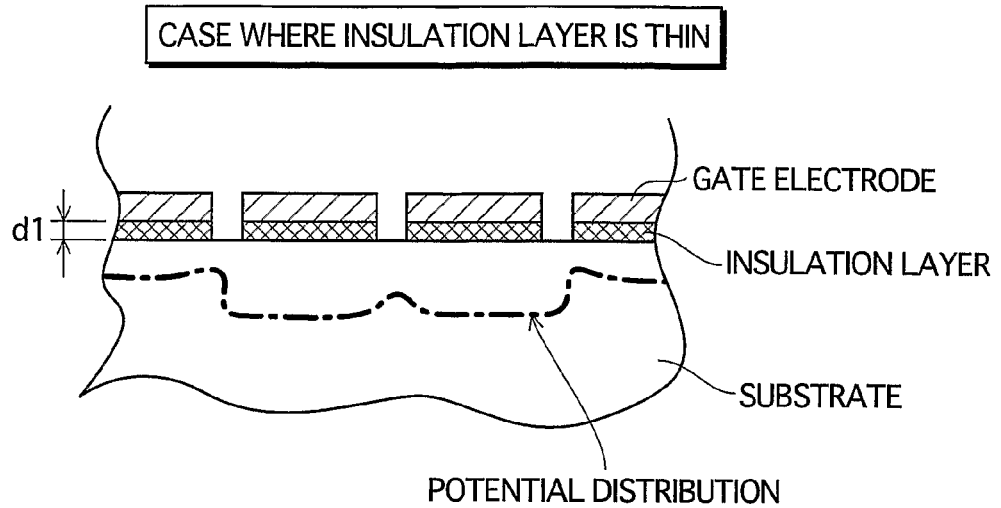
FIGS. 15A and 15B are potential distribution diagrams relating to a charge transfer portion of the third embodiment.
Figure 15B:
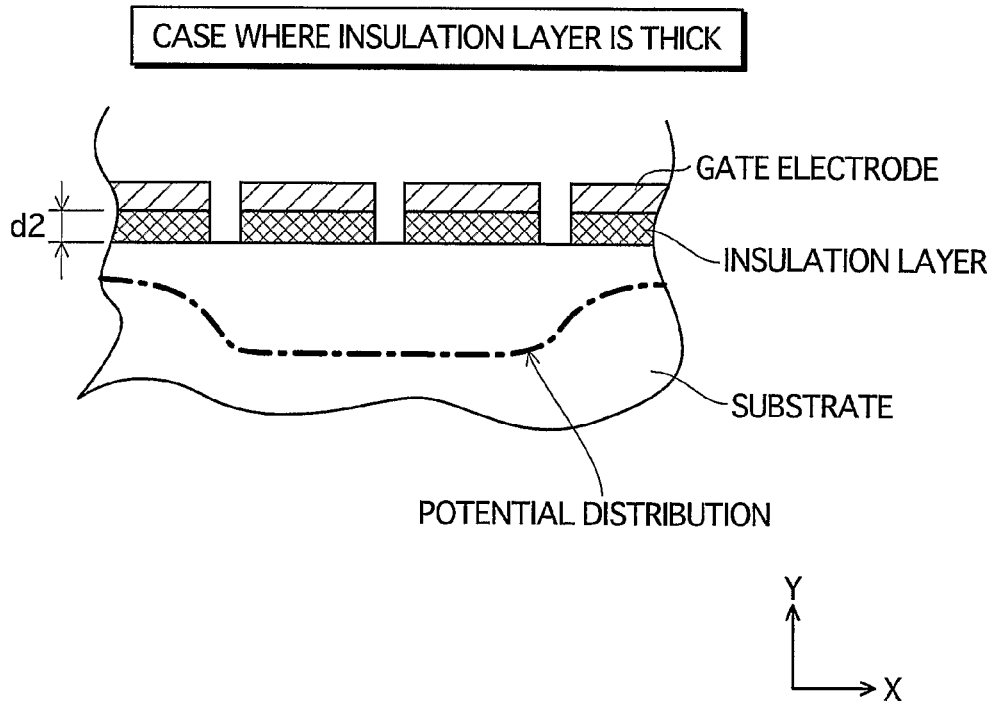

As follows, the effect that the thickening of the layer has on the horizontal CCD is considered with reference to FIGS. 15A and 15B. FIGS. 15A and 15B are respectively a schematic overview of the potential distribution. For the explanation convenience, the substrate is not illustrated with hatching. As shown in this drawing, when the gate insulation layer thickness "d1" is 20 nm, the buried channel will be shallow (FIG. 15A). Accordingly, the extension of the electric field into the charge transfer direction (direction X) as a result of voltage application to the gate electrodes is small. This tends to generate a potential distribution that inhibits charge transfer, due to gaps created between transfer electrodes (the potential distribution is shown as alternate long and short dashed lines in the drawing). Accordingly, the potential distribution will be flat in the transfer direction (direction X) below each of the gate electrodes. However, when the gate insulation layer thickness "d2" is 40 nm, the buried channel will be deep (FIG. 15B). Accordingly, application of voltage to the gate electrodes causes the electric field in the charge transfer direction to stretch to below the gaps between the gate electrodes, and forms a distribution with smooth inclination (fringing effect). In this case, the gaps created between the transfer electrodes hardly inhibit charge transfer. In sum, an insulation layer having the layer thickness of "d2" is more advantageous in terms of charge transfer than an insulation layer having the layer thickness of "d1".

As stated above, the present embodiment is able to form a horizontal CCD achieving both of favorable transfer efficiency and an optimal potential depth with respect to the power source voltage, by addition of only a few steps.

Note that in the present embodiment, the second oxidation is performed subsequent to the removal of the first oxide layer of the output amplifier. Regarding this, the preliminary oxide layer of the output amplifier is not necessarily removed before the first oxidation, and may alternatively be removed before the second oxidation at once. Still alternatively, the procedural order may be changed as long as the removal of the preliminary oxide layer of the output amplifier is performed after the first oxidation and before the second oxidation. In addition, if the optimization of the gate insulation layer thickness of the output amplifier is not so important, the procedural order may be different from the order in which the second oxidation is performed after removal of the first oxide layer of the output amplifier. Furthermore, even if the removal step of the first oxide layer is omitted, it is still possible to achieve both of the characteristic improvement for the horizontal CCD (e.g. transfer efficiency) and the improvement in shading with respect to the vertical CCD. Still further, a type of p-well having a different concentration distribution from that of the vertical CCD may be added to the horizontal CCD, by adding a mask step and an ion implantation step.

FOURTH EMBODIMENT

Figure 16:
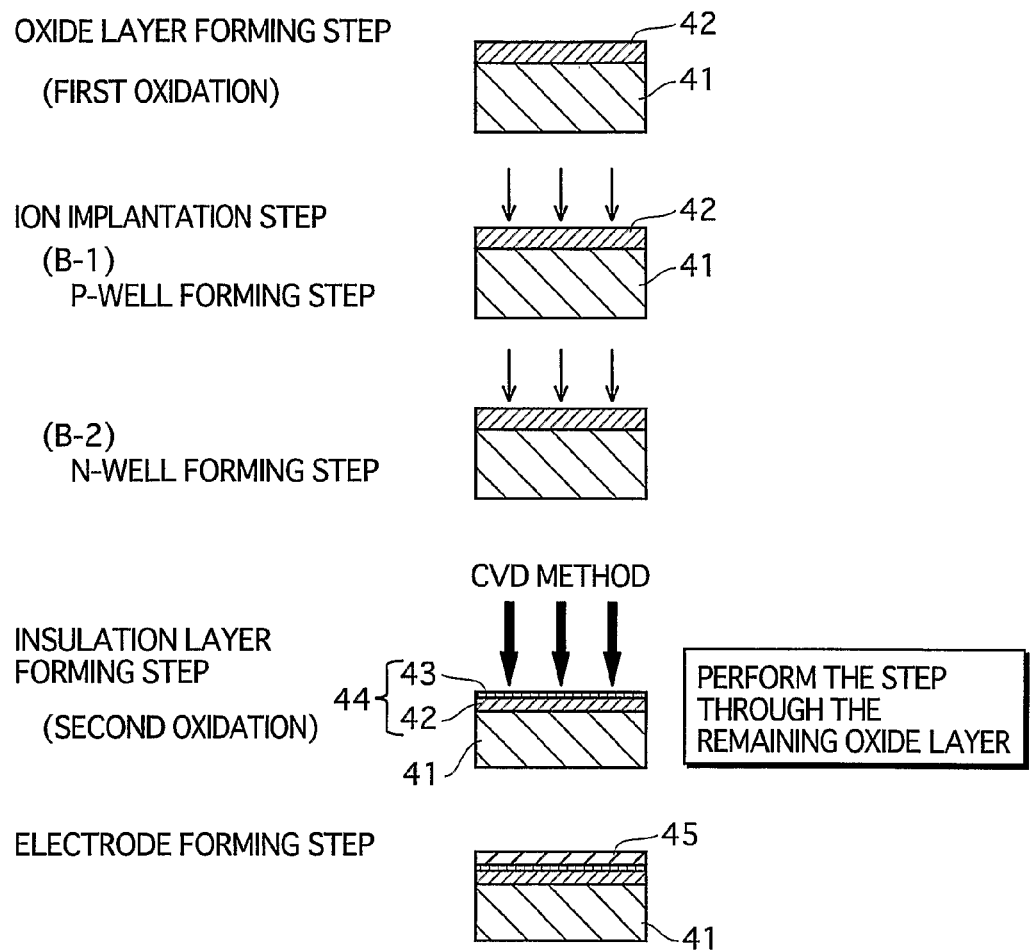
FIG. 16 is a schematic sectional diagram for showing a manufacturing method of a vertical CCD according to the fourth embodiment.

An embodiment, which is different from any of the first to third embodiments, is described using FIG. 16. The main difference of the present embodiment with the first to third embodiments lies in the insulation layer forming step. Therefore the difference is mainly discussed in the following description.

Just as in the first embodiment, the insulation layer forming step is performed after the oxide layer forming step and the ion implantation step. In the insulation layer forming step, without removing an oxide layer 42 having formed on a substrate 41, a silicon nitride layer 43 is stacked on the oxide layer 42 using a CVD method. The resulting insulation layer 44 will have a desired layer thickness, in combination of the oxide layer 42. The layer thickness relation among the layers is such that the silicon nitride layer 43 having a layer thickness of 10 nm is stacked onto the oxide layer 42 having a layer thickness of 20 nm, so as to produce an insulation layer (gate insulation layer) having a layer thickness of 30 nm.

Next, in the electrode forming step, a gate electrode 45 is formed just as in the first embodiment.

Table 4 shows an example of the oxide layer thickness transition for each of the portions described above, in the present embodiment.

TABLE 4

| Ion type | Energy | Oxide layer thickness | Rp in substrate | Insulation layer thickness |
|---|---|---|---|---|
| P | 70 KeV (70 KeV) | 20 nm(30 nm) | 50 nm(50 nm) | 30 nm(50 nm) |
| As | 120 KeV (120 KeV) | 20 nm(20 nm) | 40 nm(40 nm) | 30 nm(30 nm) |

After the stated steps, the retreat of the interface between the substrate 41 and the oxide layer 42 is restrained compared to the conventional embodiment. This is considered because of stacking the silicon nitride layer 43 onto the oxide layer 42, i.e. forming the insulation layer 44 without removing the existing oxide layer 42 just as in the first embodiment.

Here, it is also possible to remove only part of the silicon nitride layer that corresponds to the output amplifier. This arrangement is more preferable because the gate insulation layer for the output amplifier will be made thinner.

INDUSTRIAL APPLICABILITY

The manufacturing method of a solid-state imaging device of the present invention reduces shading and prevents reduction in saturated charge amount, and so is particularly of value if adopted in manufacturing a CCD solid-state imaging device mounted to a camera desired to be made small and to achieve high-resolution.

The invention claimed is:

1. A manufacturing method of a solid-state imaging device, the manufacturing method comprising: an oxide layer forming step of forming an oxide layer on a semiconductor substrate;
   an ion implantation step of performing ion implantation through the oxide layer to the semiconductor substrate thereby forming a well in a position corresponding to a charge transfer portion;
   an insulation layer forming step performed on the oxide layer having undergone the ion implantation step, at least in a position corresponding to the well;
   before the oxide layer forming step: a preliminary oxide layer forming step of forming a preliminary oxide layer on the semiconductor substrate; and a removal step of removing part of the formed preliminary oxide layer;
   an amplifier forming step of forming an output amplifier to the semiconductor substrate, the output amplifier being operable to convert to a signal voltage a signal charge outputted from the charge transfer portion and to output the signal voltage to outside, wherein the charge transfer portion includes a vertical charge transfer sub-portion and a horizontal charge transfer sub-portion, and the part of the preliminary oxide layer removed in the removal step corresponds, in position, to the vertical charge transfer sub portion and the output amplifier.

2. The manufacturing method of claim 1, wherein the insulation layer forming step is oxidation that is performed to at last one of the oxide layer and a surface of the semiconductor substrate.

3. The manufacturing method of claim 2, further comprising at least one layer-thickness adjustment step of, before the insulation layer forming step, performing etching to at least part of the oxide layer formed in the oxide layer forming step.

4. The manufacturing method of claim 3, wherein the layer-thickness adjustment step is performed after the ion implantation step.

5. The manufacturing method of claim 4, wherein a plurality of layer-thickness adjustment steps are performed.

6. The manufacturing method of claim 5, wherein the layer-thickness adjustment steps are performed both before and after the ion implantation step.

7. The manufacturing method of claim 3, wherein the layer-thickness adjustment step is performed before the ion implantation step.

8. The manufacturing method of claim 3, wherein the at least part of the oxide layer to which the etching is performed in the layer-thickness adjustment step includes the position of the oxide layer corresponding to the well.

9. The manufacturing method of claim 3, wherein in the layer-thickness adjustment step, a part of the oxide layer corresponding to the output amplifier is removed by means of the etching.

10. The manufacturing method of claim 9, wherein the layer-thickness adjustment step includes: a first substep of performing etching, to adjust a layer thickness, at least to a part of the oxide layer corresponding to the charge transfer portion; and a second substep of performing etching to the part of the oxide layer corresponding to the output amplifier for the purpose of the removal.

11. The manufacturing method of claim 2, wherein in the ion implantation Step, annealing at temperature of 950° C. or above is performed after performing the ion implantation, and oxidation performed after the ion implantation step is performed at temperature of 950° C. or below.

12. The manufacturing method of claim 1, wherein as a result of the insulation layer forming step, a silicon nitride layer is formed on the oxide layer having undergone the ion implantation step.

13. The manufacturing method of claim 12, further comprising at least one layer-thickness adjustment step of performing etching to at least part of the oxide layer.

14. The manufacturing method of claim 13, wherein the layer-thickness adjustment step is performed after the ion implantation step.

15. The manufacturing method of claim 14, wherein a plurality of layer-thickness adjustment steps are performed.

16. The manufacturing method of claim 15, wherein the layer-thickness adjustment steps are performed both before and after the ion implantation step.

17. The manufacturing method of claim 13, the layer-thickness adjustment step is performed before the ion implantation step.

18. The manufacturing method of claim 13, the at least part of the oxide layer to which the etching is performed in the layer-thickness adjustment step includes the position of the oxide layer corresponding to the well.

19. The manufacturing method of claim 13, wherein in the layer-thickness adjustment step, at least a part of the oxide layer corresponding to the output amplifier is removed by means of the etching.

20. The manufacturing method of claim 19, wherein the layer-thickness adjustment step includes: a first substep of performing etching, to adjust a layer thickness, to at least a part of the oxide layer corresponding to the charge transfer portion; and a second substep of performing etching to at least the part of the oxide layer corresponding to the output amplifier for the purpose of the removal.

21. The manufacturing method of claim 12, further comprising:
an amplifier forming step of forming an output amplifier to the semiconductor substrate, the output amplifier being operable to convert to a signal voltage a signal charge outputted from the charge transfer portion and to output the signal voltage to outside; and a removal step of removing a part of the silicon nitride layer that corresponds to the output amplifier.

22. The manufacturing method of claim 1, wherein the charge transfer portion includes a vertical charge transfer sub-portion and a horizontal charge transfer sub-portion, and in the ion implantation step, an accelerating energy of the ion implantation is set so that an implantation range of the ion implantation in the semiconductor substrate is in a range of 1 to 2 times a layer thickness of part of an insulation layer that results from the insulation layer forming step, the part of the insulation layer corresponding to the vertical charge transfer sub-portion.

23. The manufacturing method of claim 1, further comprising: a conductive-layer forming step of forming a conductive layer on an insulation layer that results from the insulation layer forming step; and a gate-electrode forming step of forming a transfer electrode by patterning the conductive layer.

* * * * *